(12) United States Patent
Luo et al.

(10) Patent No.: US 11,143,830 B2
(45) Date of Patent: Oct. 12, 2021

(54) CONNECTOR

(71) Applicant: DONGGUAN LUXSHARE TECHNOLOGIES CO., LTD, Dongguang (CN)

(72) Inventors: Zhen Luo, Dongguan (CN); Xiaokai Wang, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 16/733,673

(22) Filed: Jan. 3, 2020

(65) Prior Publication Data
US 2020/0142142 A1    May 7, 2020

(30) Foreign Application Priority Data
Nov. 7, 2018   (CN) .......................... 201811319181.9

(51) Int. Cl.
| G02B 6/42 | (2006.01) |
| H05K 7/20 | (2006.01) |
| H01R 13/516 | (2006.01) |
| H01R 13/641 | (2006.01) |
| H01R 13/717 | (2006.01) |

(52) U.S. Cl.
CPC .......... *G02B 6/4269* (2013.01); *G02B 6/426* (2013.01); *G02B 6/428* (2013.01); *G02B 6/4278* (2013.01); *H01R 13/516* (2013.01); *H01R 13/641* (2013.01); *H01R 13/717* (2013.01); *H05K 7/2039* (2013.01)

(58) Field of Classification Search
CPC ...... G02B 6/4269; G02B 6/426; G02B 6/428; G02B 6/0008; H05K 7/2039
USPC ............. 361/679.52, 688, 702, 709; 439/490
See application file for complete search history.

(56) References Cited

U.S. PATENT DOCUMENTS

| 7,621,773 | B2 * | 11/2009 | Bright | .................. | G02B 6/0008 |
| | | | | | 439/490 |
| 8,599,559 | B1 * | 12/2013 | Morrison | ............. | H05K 9/0058 |
| | | | | | 361/702 |
| 9,255,703 | B2 * | 2/2016 | Auyeung | ............... | F21V 29/713 |
| 9,910,231 | B2 * | 3/2018 | Kelty | ................... | G02B 6/4269 |
| 9,933,555 | B2 * | 4/2018 | Henry | .................... | G02B 6/008 |
| 10,455,739 | B2 * | 10/2019 | Su | ....................... | H05K 7/20509 |
| 10,588,243 | B2 * | 3/2020 | Little | ..................... | H01R 24/60 |
| 10,616,993 | B1 * | 4/2020 | Gawlowski | ........ | H05K 7/20418 |

(Continued)

FOREIGN PATENT DOCUMENTS

| CN | 1841263 A | 10/2006 |
| CN | 106990488 A | 7/2017 |

*Primary Examiner* — Stephen S Sul
(74) *Attorney, Agent, or Firm* — Birch, Stewart, Kolasch & Birch, LLP

(57) ABSTRACT

Disclosed are a heat radiating assembly and a connector. The heat radiating assembly is disposed on the connector used to mate with a docking connector having a heat generating portion. The heat radiating assembly includes a heat radiating member and a heat conduction member. The heat radiating member is provided with a trough. The heat conduction member is disposed in the trough and is configured to transfer heat of the heat generating portion to the heat radiating member, allowing the heat to be radiated through the heat radiating member. The connector includes the heat radiating assembly.

12 Claims, 6 Drawing Sheets

(56) References Cited

U.S. PATENT DOCUMENTS

| | | | | |
|---|---|---|---|---|
| 10,856,055 | B2* | 12/2020 | Weltsch | H05K 7/20772 |
| 10,886,661 | B2* | 1/2021 | Liu | G06F 1/20 |
| 2003/0161108 | A1* | 8/2003 | Bright | G02B 6/4277 |
| | | | | 361/707 |
| 2006/0291171 | A1* | 12/2006 | Ahrens | G02B 6/4292 |
| | | | | 361/716 |
| 2008/0285236 | A1* | 11/2008 | Phillips | H01R 13/6582 |
| | | | | 361/709 |
| 2009/0258534 | A1* | 10/2009 | Bright | G02B 6/4246 |
| | | | | 439/490 |
| 2011/0317964 | A1* | 12/2011 | Downs | G02B 6/4201 |
| | | | | 385/92 |
| 2012/0155108 | A1* | 6/2012 | Scholeno | G02B 6/4298 |
| | | | | 362/580 |
| 2014/0160679 | A1* | 6/2014 | Kelty | G02B 6/4269 |
| | | | | 361/700 |
| 2015/0296638 | A1* | 10/2015 | Wu | H05K 7/20409 |
| | | | | 174/548 |
| 2016/0308313 | A1* | 10/2016 | Yang | H01R 13/6587 |
| 2018/0368283 | A1* | 12/2018 | Little | H05K 7/20336 |
| 2018/0376617 | A1* | 12/2018 | Chen | G02B 6/4269 |
| 2019/0230817 | A1* | 7/2019 | Han | H05K 7/1401 |

\* cited by examiner

CONNECTOR

This application is a U.S. application which claims the benefit of and priority to China patent application No. 201811319181.9 filed on Nov. 7, 2018, the disclosure of which is hereby incorporated herein by reference in its entirety.

TECHNICAL FIELD

The present disclosure relates to the technical field of heat radiation for a connector, and more particularly relates to a heat radiating assembly and a connector.

BACKGROUND

With the development of society as well as science and technology, data transmission is developing in the direction of high-speed data transmission. In order to meet the market's demand for higher-density high-speed pluggable solutions, Quad Small Form-factor Pluggable (QSFP) is born.

The QSFP can be used as an optical fiber solution, with superior speed and density to those of a 4-channel CX4 interface. Since the QSFP is able to support data transmission of four channels at a speed of 10 Gbps per channel with the same port volume of a 10 Gigabit Small Form Factor Pluggable (XFP), the density of the QSFP can be four times the density of an XFP product, and three times the density of an SFP+ product. The QSFP which has four channels and a density higher than that of CX4 has been adopted by InfiniBand.

However, with the increase of the amounts of data transmission of a high-speed connector, the whole system and the connector can easily heat up.

Therefore, there is an urgent need for a heat radiating assembly, a connector and a connector assembly to solve the above technical problems.

SUMMARY

An object of the present disclosure is to provide a heat radiating assembly, a connector and a connector assembly which are capable of quickly radiating heat of the connector.

To achieve this object, the present disclosure adopts the following technical solutions.

The heat radiating member is provided with a trough and is configured to radiate heat.

The heat conduction member is disposed in the trough and is configured to transfer heat of the heat generating portion to the heat radiating member.

In one embodiment, the heat radiating assembly further includes a heat radiating block. The heat radiating block is disposed between the heat conduction member and the heat generating portion and is configured to transfer the heat of the heat generating portion to the heat conduction member.

In one embodiment, the heat radiating member is a heat radiating fin, and the heat conduction member is partially attached to a trough wall of the trough.

In one embodiment, the heat conduction member is a heat pipe or a vapor chamber.

Technical solution 1 is a connector used to mate with a docking connector having a heat generating portion. The connector includes a heat radiating assembly, which includes: a heat radiating member provided with a trough and configured to radiate heat; and a heat conduction member disposed in the trough and configured to transfer heat of the heat generating portion to the heat radiating member.

In one embodiment, the connector includes a metal housing and a printed circuit board (PCB), the heat generating portion is housed in the metal housing (13), and the PCB board is coupled to the heat generating portion.

The metal housing is provided with an opening. The heat radiating assembly may further include a heat radiating block disposed between the heat conduction member and the heat generating portion and configured to transfer the heat of the heat generating portion to the heat conduction member. The heating radiating block is disposed in the opening, and one side of the heat radiating block may be attached to the heat conduction member, and another side of the heat radiating block may be attached to the heat generating portion.

In one embodiment, the heat radiating member and the heat conduction member are each fixed to the connector through a fixing member.

In one embodiment, the heat radiating member is provided with a first groove, the fixing member is an elastic clip, and the elastic clip is clamped in the first groove and is fixed to the connector.

In one embodiment, the connector further includes a light guide member, and the light guide member is connected to a light emitting assembly disposed on the PCB board.

In one embodiment, the light guide member is provided with a first fixing portion, and the metal housing is provided with a second fixing portion which is configured to be interlocked with the first fixing portion.

In one embodiment, the light guide member is provided with a first fixing column, where the first fixing column is provided with at least one second fixing block, and the metal housing is provided with a fixing groove matching the second fixing block.

In one embodiment, the cross section of the at least one second fixing block is semicircular. The second fixing block is provided with a barb structure extending downwards therefrom and a guide incline on its end.

In one embodiment, the fixing groove is semicircular and includes a diameter side and a curved side. The second fixing block may include a plane side. A fixing protrusion may be disposed on the diameter side of the fixing groove and abut against the plane side of the second fixing block, and the barb structure is clamped inside the metal housing by the curved side of the fixing groove.

In one embodiment, the first fixing column may further be provided with at least one third fixing block having a semi-circular cross section. The third fixing block may include a fixing segment and an inserting segment, and the metal housing may further be provided with an additional fixing groove corresponding to the third fixing block. The inserting segment of the third fixing block is configured to be inserted into the additional fixing groove. The inserting segment may have a width that is less than or equal to a width of the fixing segment and be farther away from the first fixing column than the fixing segment.

In one embodiment, the second fixing block may be disposed relatively nearer to the PCB board than the third fixing block.

In one embodiment, the second fixing block may be disposed relatively farther away from the PCB board than the third fixing block. In one embodiment, the connector further includes a cushion block. The cushion block is disposed on the PCB board, the light guide member is provided with a second fixing column, and the second fixing column is fixed to the cushion block.

The cushion block is provided with a communicating hole, where the light emitting assembly is disposed in the communicating hole, and the second fixing column is partially accommodated in the communicating hole and is coupled to the light emitting assembly.

Technical solution 2 is another connector that includes a metal housing and a light guide member. The light guide member is provided with a first fixing column, where the first fixing column is provided with at least one second fixing block, the metal housing is provided with a fixing groove matching the second fixing block. The cross section of the at least one second fixing block is semicircular. The second fixing block is provided with a barb structure extending downwards therefrom and a guide include on its end, the fixing groove is semicircular, a fixing protrusion is disposed on a diameter side of the fixing groove and abuts against a plane side of the second fixing block, and the barb structure is clamped inside the metal housing by a curved side of the fixing groove.

In one embodiment, the first fixing column is further provided with at least one third fixing block having a semi-circular cross section. The third fixing block includes a fixing segment and an inserting segment. The metal housing is further provided with an additional fixing groove corresponding to the third fixing block, and the inserting segment of the third fixing block is configured to be inserted into the additional fixing groove, and the inserting segment has a width that is less than or equal to a width of the fixing segment and is farther away from the first fixing column than the fixing segment.

The present disclosure has the following beneficial effects: the heat generating module (e.g., optical module) would produce a great amount of heat in the use of the connector, while the heat conduction member is able to quickly transfer the heat to the heat radiating member, allowing the heat to be radiated to the air through the heat radiating member, thereby preventing the connector from burning damage or burn down caused by excessive temperatures.

In addition, the light guide member serves an indicator function whereby it is quickly and definitely determined whether related devices are coupled.

Figure 1:
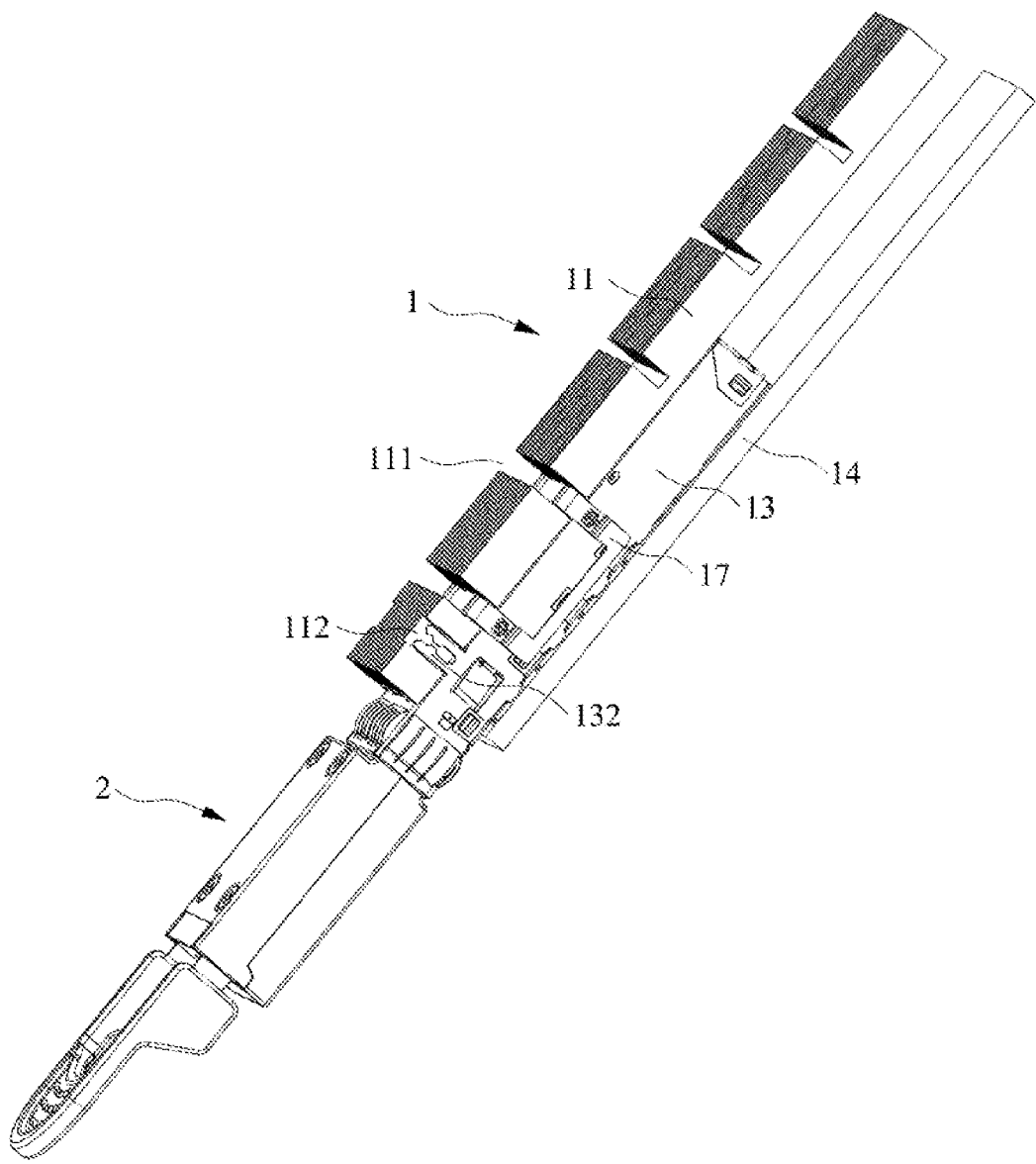
FIG. 1 is a schematic diagram of a connector assembly according to Embodiment 2 of the present disclosure.

In the accompanying drawings: 1. Connector;
- 11. Heat radiating member; 111. First groove; 112. Second groove; 113. Trough;
- 12. Heat conduction member;
- 13. Metal housing; 131. Clamping protrusion; 132. Positioning pin; 133. fixing groove; 1331. Fixing protrusion;
- 14. PCB board;
- 15. Heat generating portion;
- 16. Heat radiating block;
- 17. Elastic clip; 171. Clamping groove;
- 18. Light guide member; 181. First fixing portion; 182. First fixing column; 1821. Second fixing block; 1822. Guide incline; 1823. Barb structure; 183. Second fixing column; 1831. Limit stop block;
- 19. Cushion block; 191. Communicating hole; 192. Limit block.
- 2. Docking connector.

DETAILED DESCRIPTION

The technical solutions of the present disclosure will be further described below through specific embodiments in conjunction with the accompanying drawings.

In Embodiment 1, the embodiment discloses a heat radiating assembly, which includes a heat radiating member, a heat conduction member, and a heat radiating block. The heat radiating member is a heat radiating fin, the heat radiating fin is provided with multiple heat radiating sheets, which can expand the heat radiating area of the heat radiating member, accelerating the heat radiating rate. As an example and exemplary implementation, the heat conduction member in this embodiment is a heat pipe, and may also be a vapor chamber in other embodiments. The heat pipe and the vapor chamber both feature a high heat conduction rate; they are able to transfer heat to every portion of the heat conduction member thus expanding the heat conduction area.

Since the part where heat needs to be radiated of a piece subjected to heat dissipation is usually located within a housing of the piece subjected to heat dissipation, a heat radiating block may be disposed between the piece subjected to heat dissipation and the heat conduction member, where both sides of the heating radiating block are attached to the part where heat needs to be radiated of the piece subjected to heat dissipation and the heat conduction member respectively, and the heat radiating member is attached to a side of the heat conduction member away from the piece subjected to heat dissipation. The material of the heat radiating block may be a metal material with high thermal conductivity, such as cooper, aluminum alloy, or the like.

The surface of each of the heat conduction member and the heat radiating member is typically set to have the same area as one side surface of the piece subjected to heat dissipation, and an opening is provided in the piece subjected to heat dissipation, with the heat radiating block being disposed in the opening. The heat radiating block is in contact with only a part of the surface of the heat conduction member. Nevertheless, the heat conduction member is operative to quickly transfer the heat to every portion of the heat conduction member, such that every portion of the heat conduction member has substantially the same surface temperature. The contact area of the heat conduction member and the heat radiating member is far larger than the contact area of the heat conduction member and the heat radiating block, which can accelerate the heat radiating of the heat conduction member and thus accelerate the heat radiating of the heat radiating block, thereby accelerating the heat radiating rate of the piece subjected to heat dissipation.

Figure 2:
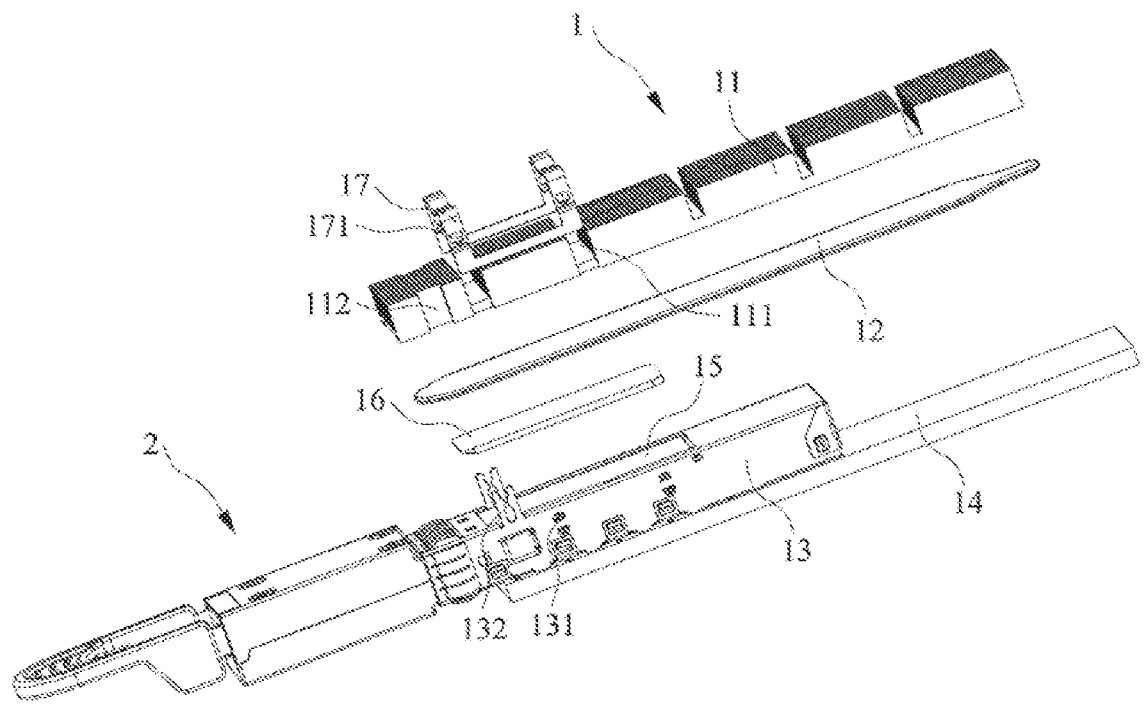
FIG. 2 is an exploded view illustrating the connector assembly according to Embodiment 2 of the present disclosure.
Figure 3:
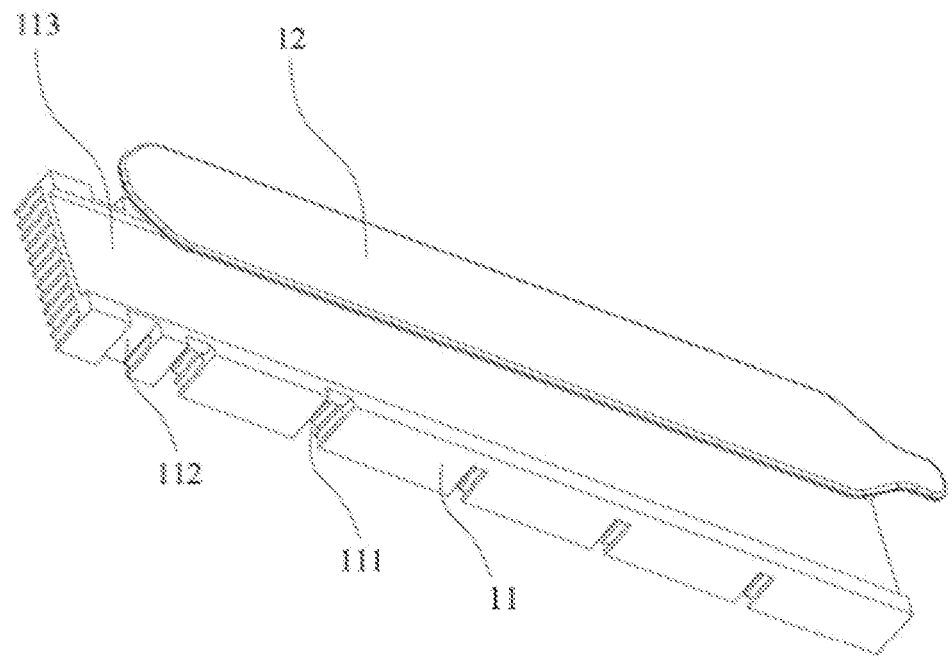
FIG. 3 is a schematic diagram of a heat radiating assembly according to Embodiment 2 of the present disclosure.
Figure 4:
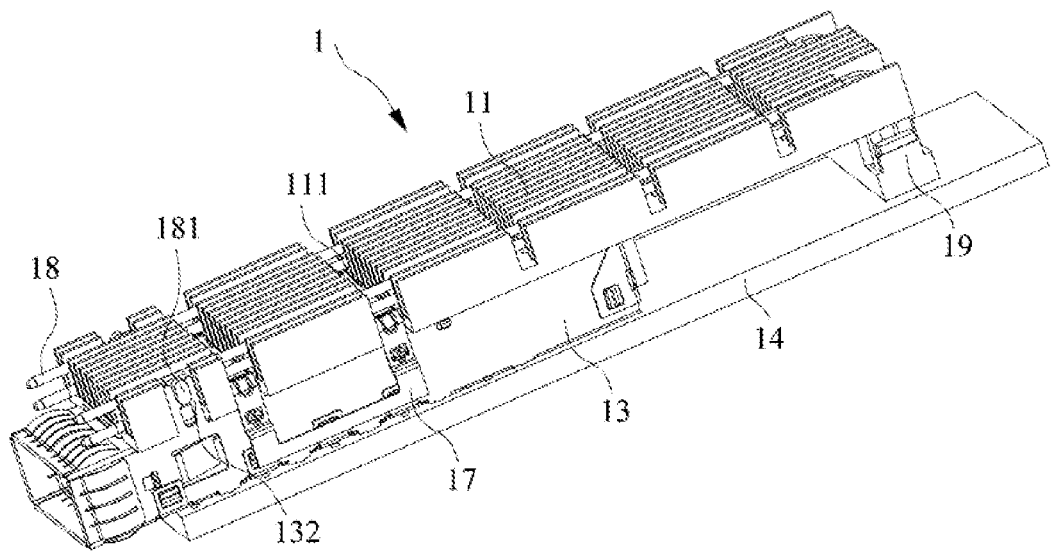
FIG. 4 is a schematic diagram of a connector according to Embodiment 3 of the present disclosure.

In Embodiment 2, as illustrated in FIGS. 1 to 3, a connector assembly is disclosed. The connector assembly includes a connector 1 and a docking connector 2 mated with the connector 1. In other words, the connector 1 is used to mate with the docking connector 2.

The connector 1 includes the heat radiating assembly described in Embodiment 1, and further includes a metal housing 13, and a PCB board 14. The docking connector 2 has a heat generating portion 15, and the heat generating portion 15 is housed in the metal housing 13. In some embodiments, the heat generating portion 15 may be an optical module. The PCB board 14 is electrically connected to the heat generating portion 15. The metal housing 13 is provided with an opening, and the opening is located above the heat generating portion 15. The heat radiating block 16 is disposed in the opening. The bottom surface of the heat radiating block 16 is attached to the upper surface of the heat generating portion 15, The upper surface of the heat radiating block 16 is flush with the upper surface of the metal housing 13. A part of the lower surface of the heat conduction member 12 is attached to the heat radiating block 16, and the remaining part of the lower surface of the heat conduction member 12 is attached to the upper surface of the metal housing 13. The heat radiating sheets of the heat radiating member 11 are disposed on the upper surface of the heat radiating member 11. The lower surface of the heat radiating member 11 is provided with a trough 113 which accommodates the heat conduction member 12. The upper surface of the heat conduction member 12 is attached to the bottom surface of the trough 113, and the both sides of the heat conduction member 12 are attached to two side walls of the trough 113 to enhance the thermal conduction efficiency between the heat conduction member 12 and the heat radiating member 11.

The heat radiating member 11 and the heat conduction member 12 are each fixed to the connector 1 through a fixing member. Specifically, the heat radiating member 11 is further provided with a first groove 111, the width of the heat radiating member 11 is larger than the width of the metal housing 13. The first groove 111 runs through the upper portion and two sides of the heat radiating member 11. In this embodiment, the fixing member is an elastic clip 17, which includes two clamps, and two ends of each of the two clamps are connected to each other through a connection piece. Correspondingly, the heat radiating member 11 is provided with two first grooves 111. The two ends of the clamp are provided with clamping grooves 171, and the metal housing 13 is provided with clamping protrusions 131 corresponding to the clamping grooves 171. The clamp is clamped in the first groove 111 and clamped and fixed to the metal housing 13.

Two sides of the metal housing 13 are each provided with a positioning pin 132 extending upwards. Two sides of the heat radiating member 11 are provided with second grooves 112, and the positioning pin 132 is clamped in the second groove 112 to limit the heat radiating block 16, such that the elastic clip 17 clamps and secures the heat radiating member 11.

When using the connector 1, the heat generating portion 15 may produce a large amount of heat. Most of the heat may be transferred to the heat conduction member 12 through the heat radiating block 16, and a small portion of the heat is transferred to the metal housing 13 through other components in the connector 1 and the air. The heat transferred to the heat conduction member 12 through the heat radiating block 16 is rapidly radiated in the heat conduction member 12 thanks to the characteristics of the heat conduction member 12, so that the temperature of the whole heat conduction member 12 would rise. The heat conduction member 12 may transfer the heat to the heat radiating member 11, and the heat radiating member 11 may rapidly dissipate the heat to the air through the heat radiating sheets. A part of the heat transferred to the metal housing 13 is radiated in the air through the metal housing 13, while the other part is transferred to the heat conduction member 12, and the heat of the heat conduction member 12 is radiated in the air through the heat radiating member 11. Therefore, the heat of the heat generating portion 15 is rapidly radiated, and thus the temperature of the heat generating portion 15 will not be excessively. In such a way, the connector 1 will not be burnt to the point of being damaged or even destroyed because of large amounts of heat that are produced during high-density high-speed data transmission and that are not able to be dissipated.

In Embodiment 3, as illustrated in FIGS. 4 to 9, a connector 1 is disclosed. The connector 1 has the same structure as the connector 1 described in Embodiment 2, and further includes a light guide member 18 and a cushion block 19 in addition to the arrangement illustrated in Embodiment 2. Furthermore, there are some differences in structures of the heat radiating member 11 and the heat conduction member 12 between the forgoing Embodiments 1 and 2. In this embodiment, in particular, the number of light guide members 18 is two, and the two light guide members 18 are disposed on the left and the right side of the connector 11 respectively.

Figure 5:
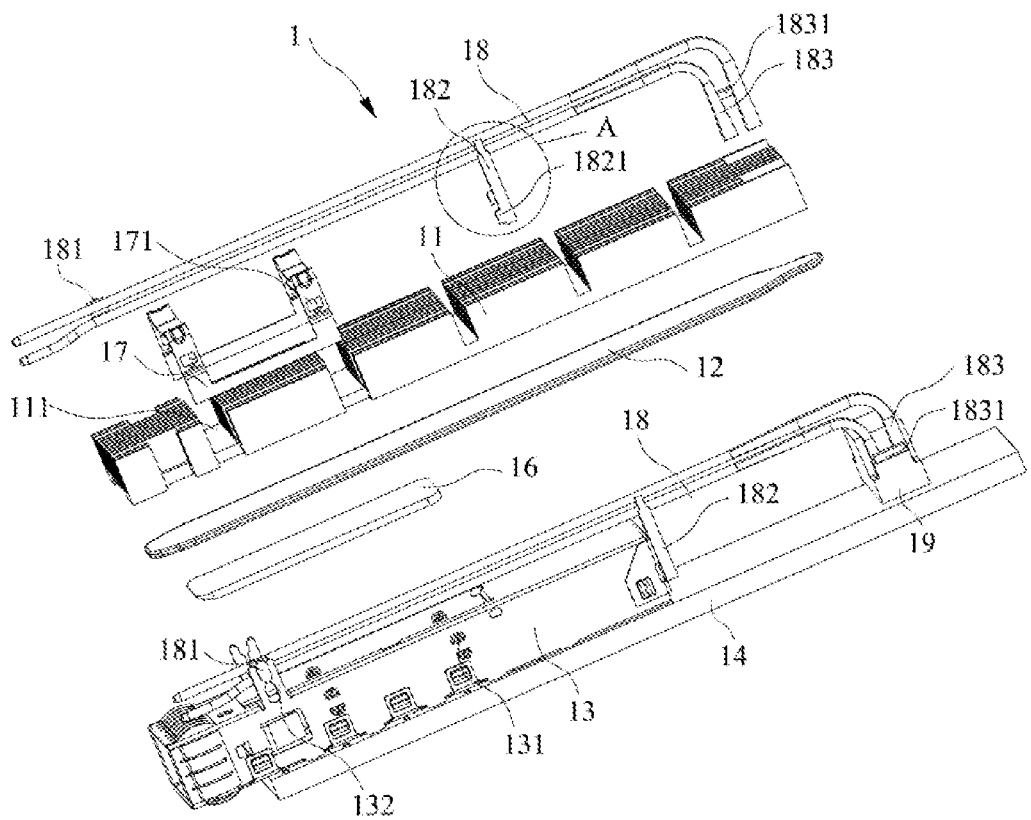
FIG. 5 is an exploded view illustrating a connector according to Embodiment 3 of the present disclosure.

As illustrated in FIG. 5, the light guide member 18 includes two light guide columns that are disposed in parallel. One end of each of the two light guide columns is connected to each other through a connection block. The connection block is provided with a first fixing portion 181. The positioning pins 132 of the metal housing 13 are provided with a second fixing portion matching the first fixing portion 181. Typically, in this embodiment, the first fixing portion 181 is a first fixing block disposed on the connection block, the second fixing portion is two elastic arms disposed on the positioning pins 132, and the first fixing block is clamped between the two elastic arms, such that this end of the light guide member 18 is secured to the metal housing 13. In other embodiments, the first fixing portion 181 may also be two elastic arms disposed on the connection block, and the second fixing portion may be the first fixing block disposed on the positioning pins 132.

In the central position of the light guide member 18, a first fixing column 182 that connects the two light guide columns is disposed. The first fixing column 182 extends downwards and is provided with a second fixing block 1821. In this embodiment, the first fixing column 182 is provided with one second fixing blocks 1821. In some embodiments, the first fixing column 182 is provided with two or more second fixing blocks 1821. The heat radiating member 11 and/or the heat conduction member 12 are provided with a first through hole, and the first fixing column 182 passes through the first through hole and is fixedly connected to an end wall of the metal housing 13.

Figure 6A:
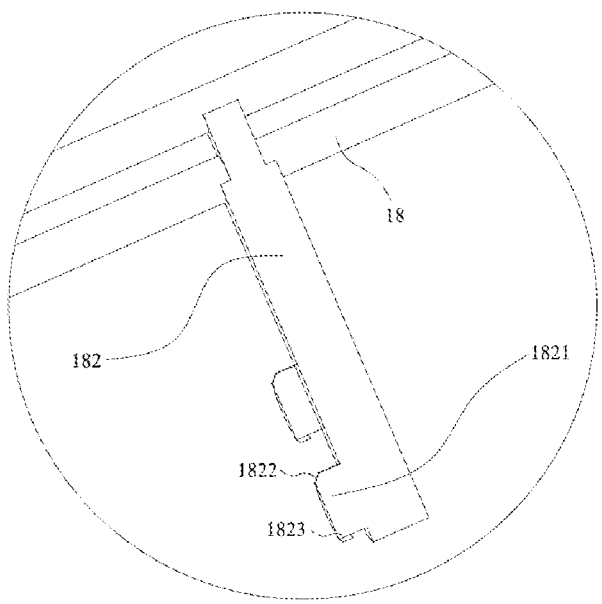
FIG. 6A is an enlarged view illustrating Portion A shown in FIG. 5.
Figure 6B:
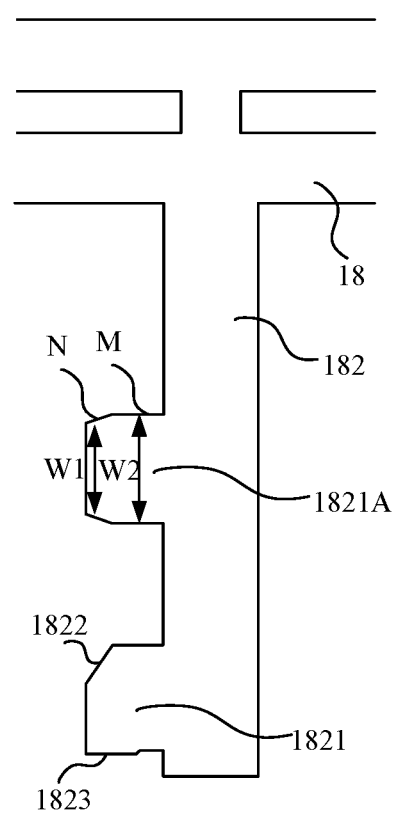
FIG. 6B is a schematic diagram illustrating an alternative configuration of the Portion A to that shown in FIG. 6A in accordance with an embodiment of the present disclosure.
Figure 6C:
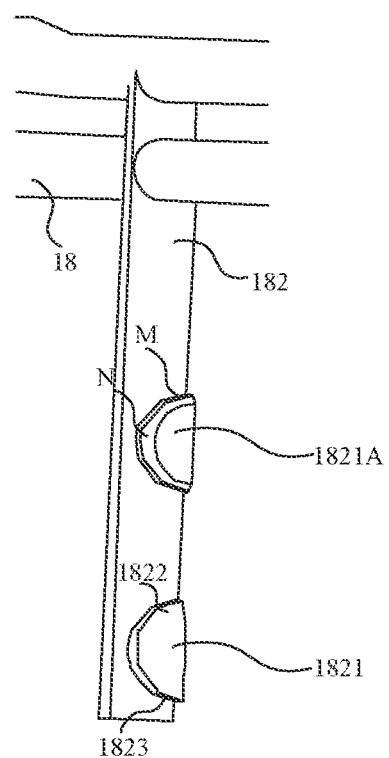
FIG. 6C is a perspective diagram of the Portion A illustrated in FIG. 6B viewed from another perspective.
Figure 7:
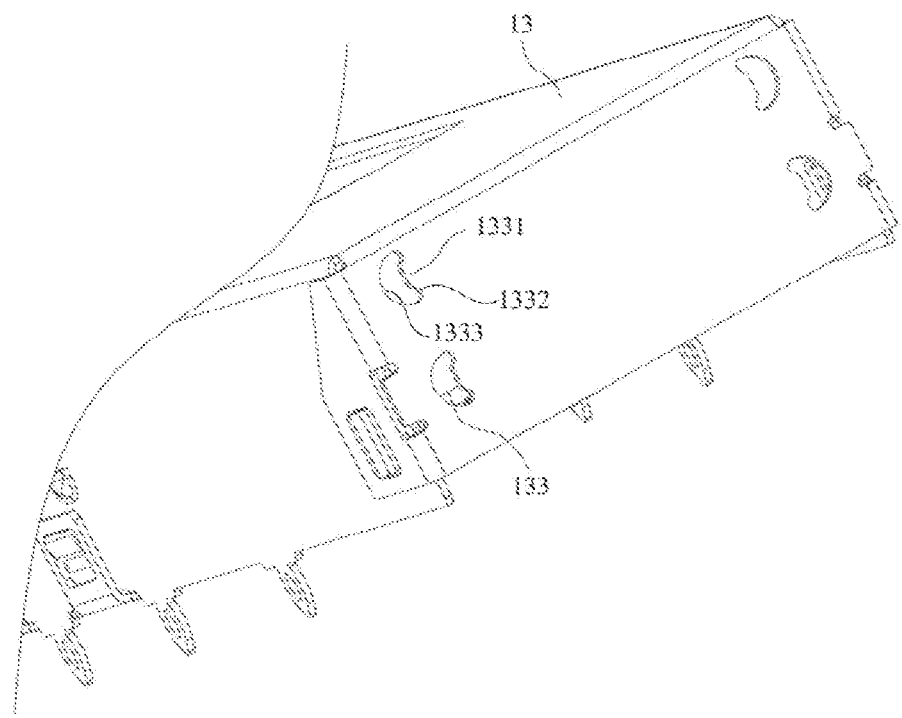
FIG. 7 is a partial schematic diagram of a metal housing according to Embodiment 3 of the present disclosure.

As illustrated in FIGS. 5 to 7, the end wall of the metal housing 13 is provided with a fixing groove 133 matching the second fixing block 1821. The cross section of the second fixing block 1821 is semicircular, and the second fixing block 1821 is provided with a barb structure 1823 and a guide incline 1822 on its end. The barb structure 1823 extends downwards from the second fixing block 1821. The fixing groove 133 is semicircular, and a fixing protrusion 1331 is disposed on a diameter side of the fixing groove 133.

The second fixing block 1821 is inserted into the fixing groove 133 under the guidance of the guide incline 1822, the fixing protrusion 1331 abuts against a plane side of the second fixing block 1821, and the barb structure 1823 is clamped inside the metal housing 13 by a curved side of the fixing groove 133. This clamping structure can effectively prevent the second fixing block 1821 from falling off from the fixing groove 133 due to vibration.

In the embodiment illustrated in FIG. 6A, the first fixing column 182 is shown as provided with two second fixing blocks 1821, but the present disclosure will not be limited thereto. For example, in some embodiments, the first fixing column 182 may be provided with only one of the second fixing block 1821.

Alternatively, in some other embodiments, as illustrated in FIGS. 6B and 6C, the first fixing column 182 may further be provided with a third fixing block 1821A having a semi-circular cross section, in addition to the other second fixing block 1821. In particular, the third fixing block 1821A may include a fixing segment M and an inserting segment N, where the inserting segment N is farther away from the first fixing column 182 compared with the fixing segment M, and the inserting segment N has a width W1 that is less than or equal to a width W2 of the fixing segment M. In some embodiments, the first fixing column 182 may be provided with at least one second fixing block 1821 and at least one third fixing block 1821A. In the embodiment as illustrated in FIGS. 6B and 6C, the first fixing column 182 is provided with one second fixing block 1821 and one third fixing block 1821A, where the second fixing block 1821 is located relatively nearer to the PCB board 14 compared with the third fixing block 1821A. However, the present disclosure will not be limited thereto. For example, in some other embodiments, the second fixing block 1821 may also be relatively farther away from the PCB board 14 compared with the third fixing block 1821A. Because with the third fixing block 1821A the width W1 of the inserting segment N is less than or equal to the width W2 of the fixing segment M, the inserting segment N can be easily inserted into the fixing groove 133, thus facilitating the insertion.

Figure 8:
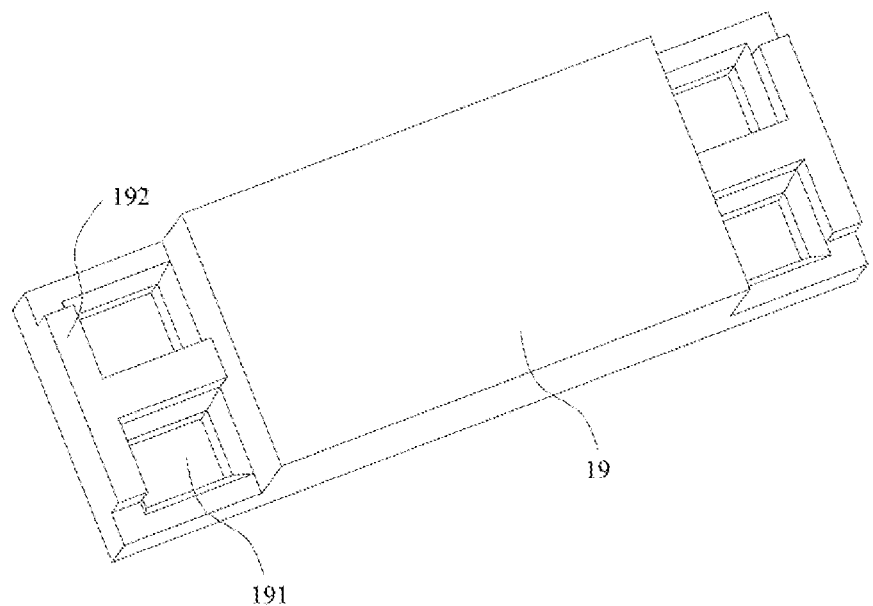
FIG. 8 is a schematic diagram of a cushion block observed from an angle of view according to Embodiment 3 of the present disclosure.
Figure 9:
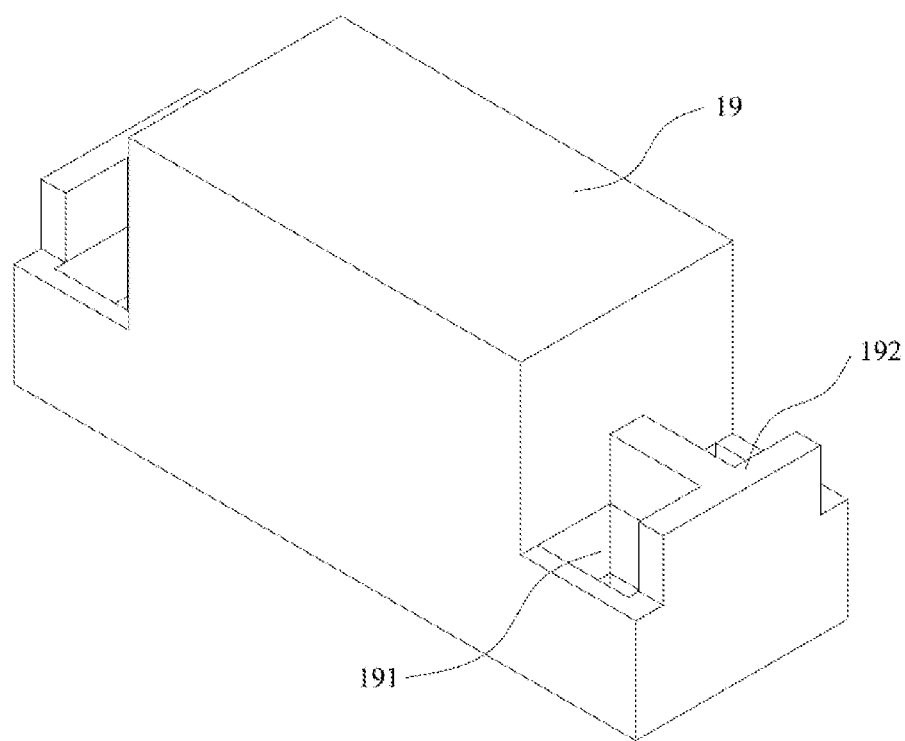
FIG. 9 is a schematic diagram of a cushion block observed from another angle of view according to Embodiment 3 of the present disclosure.

As illustrated in FIGS. 5, 8 and 9, the other end of the light guide column is bent to form a second fixing column 183, and two second fixing columns 183 are connected to each other through a limit stop block 1831. The heat radiating member 11 and/or the heat conduction member 12 are provided with a second through hole, and the second fixing column 183 passes through the second through hole and is connected to the cushion block 19 disposed on one end of the PCB board 14. The cushion block 19 is fixed to the PCB board 14 and is provided with a communicating hole 191 that allows the second fixing column 183 to be partially inserted. The cushion block 19 is further provided with a limit block 192 that abuts against the limit stop 1831 and thus can prevent the second fixing column 183 from excessively inserting into the communicating hole 191. The PCB board 14 is provided with a light emitting assembly. The light emitting assembly is disposed in the communicating hole 191 and is optically connected to the second fixing column 183, that is, the second fixing column 183 is made of transparent materials, and the light emitted by the light emitting assembly can be refracted into the second fixing column 183 to make the light guide member 18 emit light.

The light source of the light emitting assembly is disposed in the communicating hole 191, to reduce the diffusion of the light emitted from the light emitting assembly, such that the light of the light emitting assembly can be totally transferred to the second fixing column 183.

In the embodiments that the heat generating portion 15 is an optical module, the light emitting assembly can indicate whether the PCB board 14 is coupled with the optical module 15. After the PCB board 14 is coupled with the optical module 15, the light emitting assembly displays the light source and transmits the light source to the light guide member 18, and the light guide member 18 emits the light for easy observation. If the light guide member 18 doesn't emit light, it means that the PCB board 14 is not coupled with the optical module 15.

One light emitting assembly corresponding to each light guide member 18 is disposed on the PCB board 14. In this embodiment, one of the two light guide members 18 is configured to indicate whether the PCB board 14 is coupled with the optical module 15, and the other is configured to indicate whether the connector 1 is coupled with a connector 1 which is docked with the connector 1. If the docking connector 2 is coupled with the connector 1, the other light guide member 18 emits light; otherwise, the other light guide member 18 does not emit light.

The light guide member 18 is larger than the light emitting assembly, and is exposed outside the connector 1 for easy observation.

Embodiments of the present disclosure further discloses a connector assembly, which includes the connector 1 described above and a docking connector 2 which is mated with the connector 1.

Apparently, the foregoing embodiments of the present disclosure are merely illustrative of the present disclosure and are not intended to limit the embodiments disclosed herein. For those having ordinary skill in the art, alterations or modifications in other different forms can be made based on the foregoing description. Embodiments of the present disclosure cannot be and do not need to be exhausted herein. Any modifications, equivalent substitutions and improvements within the spirit and principle of the present disclosure shall all fall within the scope of the claims appended to the present disclosure.

What is claimed is:

1. A connector, used to mate with a docking connector having a heat generating portion, the connector comprising:
    a heat radiating assembly, comprising:
    a heat radiating member provided with a trough and configured to radiate heat; and
    a heat conduction member disposed in the trough and configured to transfer heat of the heat generating portion to the heat radiating member;
    wherein the connector comprises a metal housing and a printed circuit board (PCB), the heat generating portion is housed in the metal housing, and the PCB is coupled to the heat generating portion;
    wherein the connector further comprises: a light guide member coupled to a light emitting assembly disposed on the PCB;
    wherein the light guide member is provided with a first fixing column, wherein the first fixing column is provided with at least one second fixing block, and the metal housing is provided with a fixing groove matching the at least one second fixing block;
    wherein a cross section of the at least one second fixing block is semicircular, the at least one second fixing block is provided with a barb structure extending downwards therefrom and a guide incline on its end.

2. The connector of claim 1, wherein the metal housing is provided with an opening, the heat radiating assembly further comprises a heat radiating block disposed between the heat conduction member and the heat generating portion and configured to transfer the heat of the heat generating portion to the heat conduction member, the heating radiating block is disposed in the opening, and one side of the heating radiating block is attached to the heat conduction member, and another side of the heat radiating block is attached to the heat generating portion.

3. The connector of claim 2, wherein the heat radiating member and the heat conduction member are each fixed to the connector through a fixing member.

4. The connector of claim 3, wherein the heat radiating member is provided with a first groove, the fixing member is an elastic clip, which is clamped in the first groove and is fixed to the metal housing.

5. The connector of claim 1, wherein the light guide member is provided with a first fixing portion, and the metal housing is provided with a second fixing portion which is configured to be interlocked with the first fixing portion.

6. The connector of claim 1, wherein the fixing groove is semicircular and comprises a diameter side and a curved side, the at least one second fixing block comprises a plane side, and wherein a fixing protrusion is disposed on the diameter side of the fixing groove and abuts against the plane side of the at least one second fixing block, and the barb structure is clamped inside the metal housing by the curved side of the fixing groove.

7. The connector of claim 1, wherein the first fixing column is further provided with at least one third fixing block having a semi-circular cross section, the at least one third fixing block comprises a fixing segment and an inserting segment, the metal housing is further provided with an additional fixing groove corresponding to the at least one third fixing block, and the inserting segment of the at least one third fixing block is configured to be inserted into the additional fixing groove, wherein the inserting segment has a width that is less than or equal to a width of the fixing segment and is farther away from the first fixing column than the fixing segment.

8. The connector of claim 7, wherein the at least one second fixing block is disposed relatively nearer to the PCB than the at least one third fixing block.

9. The connector of claim 7, wherein the at least one second fixing block is disposed relatively farther away from the PCB than the at least one third fixing block.

10. The connector of claim 1, further comprising:
a cushion block disposed on the PCB, wherein the light guide member is provided with a second fixing column fixed to the cushion block; and
the cushion block is provided with a communicating hole, wherein the light emitting assembly is disposed in the communicating hole, and the second fixing column is partially accommodated in the communicating hole and is coupled to the light emitting assembly.

11. A connector, comprising:
a metal housing; and
a light guide member provided with a first fixing column, wherein the first fixing column is provided with at least one second fixing block, the metal housing is provided with a fixing groove matching the at least one second fixing block, a cross section of the at least one second fixing block is semicircular, the at least one second fixing block is provided with a barb structure extending downwards therefrom and a guide incline on its end, the fixing groove is semicircular, a fixing protrusion is disposed on a diameter side of the fixing groove and abuts against a plane side of the at least one second fixing block, and the barb structure is clamped inside the metal housing by a curved side of the fixing groove.

12. The connector of claim 11, wherein the first fixing column is further provided with at least one third fixing block having a semi-circular cross section, the at least one third fixing block comprises a fixing segment and an inserting segment, the metal housing is further provided with an additional fixing groove corresponding to the at least one third fixing block, and the inserting segment of the at least one third fixing block is configured to be inserted into the additional fixing groove, and the inserting segment has a width that is less than or equal to a width of the fixing segment and is farther away from the first fixing column than the fixing segment.

* * * * *